(12) United States Patent
Wu et al.

(10) Patent No.: US 12,035,539 B2
(45) Date of Patent: Jul. 9, 2024

(54) MAGNETIC MEMORY AND READING/WRITING METHOD THEREOF

(71) Applicant: CHANGXIN MEMORY TECHNOLOGIES, INC., Hefei (CN)

(72) Inventors: Baolei Wu, Hefei (CN); Xiaoguang Wang, Hefei (CN); Yulei Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 296 days.

(21) Appl. No.: 17/480,357

(22) Filed: Sep. 21, 2021

(65) Prior Publication Data

US 2022/0208853 A1 Jun. 30, 2022

Related U.S. Application Data (63) Continuation of application No. PCT/CN2021/095841, filed on May 25, 2021.

(30) Foreign Application Priority Data

Dec. 29, 2020 (CN) .......................... 202011596090.7

(51) Int. Cl.
  *G11C 11/16* (2006.01)
  *H10B 61/00* (2023.01)
  *H10N 50/80* (2023.01)

(52) U.S. Cl.
  CPC ............ *H10B 61/10* (2023.02); *G11C 11/161* (2013.01); *G11C 11/1659* (2013.01);
  (Continued)

(58) Field of Classification Search
  CPC ................................ H10B 51/10; G11C 11/16
  (Continued)

(56) References Cited

U.S. PATENT DOCUMENTS

| 8,400,823 B2 * | 3/2013 | Xi ....................... G11C 11/1675 |
| | | 365/158 |
| 10,290,679 B1 | 5/2019 | Bhushan et al. |

(Continued)

FOREIGN PATENT DOCUMENTS

| CN | 105405860 A | 3/2016 |
| CN | 107112049 A | 8/2017 |
| CN | 109087994 A | 12/2018 |

OTHER PUBLICATIONS

International Search Report as cited in PCT/CN2021/095841 mailed Sep. 29, 2021, 8 pages.

*Primary Examiner* — Muna A Techane
(74) *Attorney, Agent, or Firm* — Kilpatrick Townsend & Stockton LLP (57) ABSTRACT

The present application provides a magnetic memory and a reading/writing method thereof. The magnetic memory includes at least one cell layer, the cell layer including: a plurality of paralleled first conductors located in a first plane; a plurality of paralleled second conductors located in a second plane, the first plane being parallel to the second plane, a projection of the second conductor on the first plane intersecting with the first conductor; a plurality of memory elements arranged between the first plane and the second plane, the memory element including a magnetic tunnel junction and a bidirectional gating device arranged in series along a direction perpendicular to the first plane, the magnetic tunnel junction being connected to the first conductor, the bidirectional gating device being connected to the second conductor, and the bidirectional gating device being configured to be turned on when a threshold voltage and/or a threshold current are/is applied.

17 Claims, 5 Drawing Sheets

(52) U.S. Cl.
CPC ...... *G11C 11/1673* (2013.01); *G11C 11/1675* (2013.01); *H10B 61/22* (2023.02); *H10N 50/80* (2023.02)

(58) Field of Classification Search
USPC ........................................................ 365/158
See application file for complete search history.

(56) References Cited

U.S. PATENT DOCUMENTS

| | | |
|---|---|---|
| 11,538,857 B2 * | 12/2022 | Wei ..................... G11C 11/1659 |
| 2008/0037314 A1 * | 2/2008 | Ueda ..................... H10B 61/10 365/158 |
| 2014/0157065 A1 * | 6/2014 | Ong ..................... G06F 15/7821 714/718 |
| 2014/0211552 A1 | 7/2014 | Pi et al. |
| 2018/0122825 A1 * | 5/2018 | Lupino ............. H01L 27/11898 |
| 2019/0172871 A1 * | 6/2019 | Yang ................... H01F 10/3254 |
| 2020/0194666 A1 | 6/2020 | Araki |

* cited by examiner

MAGNETIC MEMORY AND READING/WRITING METHOD THEREOF

CROSS-REFERENCE TO RELATED APPLICATIONS

This application is a continuation application of International Patent Application No. PCT/CN2021/095841, filed on May 25, 2021, which claims priority to Chinese Patent Application No. 202011596090.7, filed on Dec. 29, 2020. International Patent Application No. PCT/CN2021/095841 and Chinese Patent Application No. 202011596090.7 are incorporated herein by reference in their entireties.

TECHNICAL FIELD

The present application relates to the field of integrated circuits, and in particular, to a magnetic memory and a reading/writing method thereof.

BACKGROUND

An MRAM (Magneto-resistive Random Access Memory) is a non-volatile magnetic memory, which provides performance comparable to that of a volatile static random access memory (SRAM) and density and lower power consumption comparable to those of a volatile dynamic random access memory (DRAM). Compared with a non-volatile memory (NVM) flash memory which can only be overwritten a limited number of times, the MRAM provides faster access time and undergoes minimal degradation over time.

A core of an MRAM element is a magnetic tunnel junction (MTJ), which may include a fixed magnetic layer and a free magnetic layer. Magnetization polarity of the fixed magnetic layer is unchangeable, while magnetization polarity of the free magnetic layer is changeable. Due to a tunnel magnetoresistance effect, a resistance value between the fixed magnetic layer and the free magnetic layer changes with a switch in the magnetization polarity of the free magnetic layer, so as to realize a write to the magnetic memory.

However, memory density is one of the key limitations that push the MRAM to a major memory/storage market, so how to improve density of the magnetic memory is an urgent issue to be solved currently.

SUMMARY

The technical problem to be solved in the present application is to provide a high-density magnetic memory and a reading/writing method thereof.

In order to solve the above problem, the present application provides a magnetic memory, including at least one cell layer, the cell layer including: a plurality of paralleled first conductors located in a first plane; a plurality of paralleled second conductors located in a second plane, the first plane being parallel to the second plane, and a projection of the second conductor on the first plane intersecting with the first conductor; and a plurality of memory elements arranged between the first plane and the second plane, the memory element including a magnetic tunnel junction and a bidirectional gating device arranged in series along a direction perpendicular to the first plane, the magnetic tunnel junction being connected to the first conductor, the bidirectional gating device being connected to the second conductor, and the bidirectional gating device being configured to be turned on when a threshold voltage and/or a threshold current are/is applied.

The present application further provides a reading/writing method of a magnetic memory, the magnetic memory including at least one cell layer, the cell layer including: a plurality of paralleled first conductors located in a first plane; a plurality of paralleled second conductors located in a second plane, the first plane being parallel to the second plane, and a projection of the second conductor on the first plane intersecting with the first conductor; and a plurality of memory elements arranged between the first plane and the second plane, the memory element including a magnetic tunnel junction and a bidirectional gating device arranged in series along a direction perpendicular to the first plane, the magnetic tunnel junction being connected to the first conductor, the bidirectional gating device being connected to the second conductor, and the bidirectional gating device being configured to be turned on when a threshold voltage and/or a threshold current are/is applied;

the reading/writing method including: providing a first current to the magnetic memory, the first current flowing through the first conductor without flowing through the memory element, so that the memory element is in a first memory state; and providing a second current to the magnetic memory, the second current flowing through a selected memory element, so that the selected memory element changes from the first memory state to a second memory state.

The present application has the following advantages: a conventional magnetic memory design is changed, and memory density of the magnetic memory is greatly increased.

DESCRIPTION OF EMBODIMENTS

Specific implementations of a magnetic memory and a reading/writing method thereof according to the present application are described in detail below with reference to the accompanying drawings.

Figure 1:
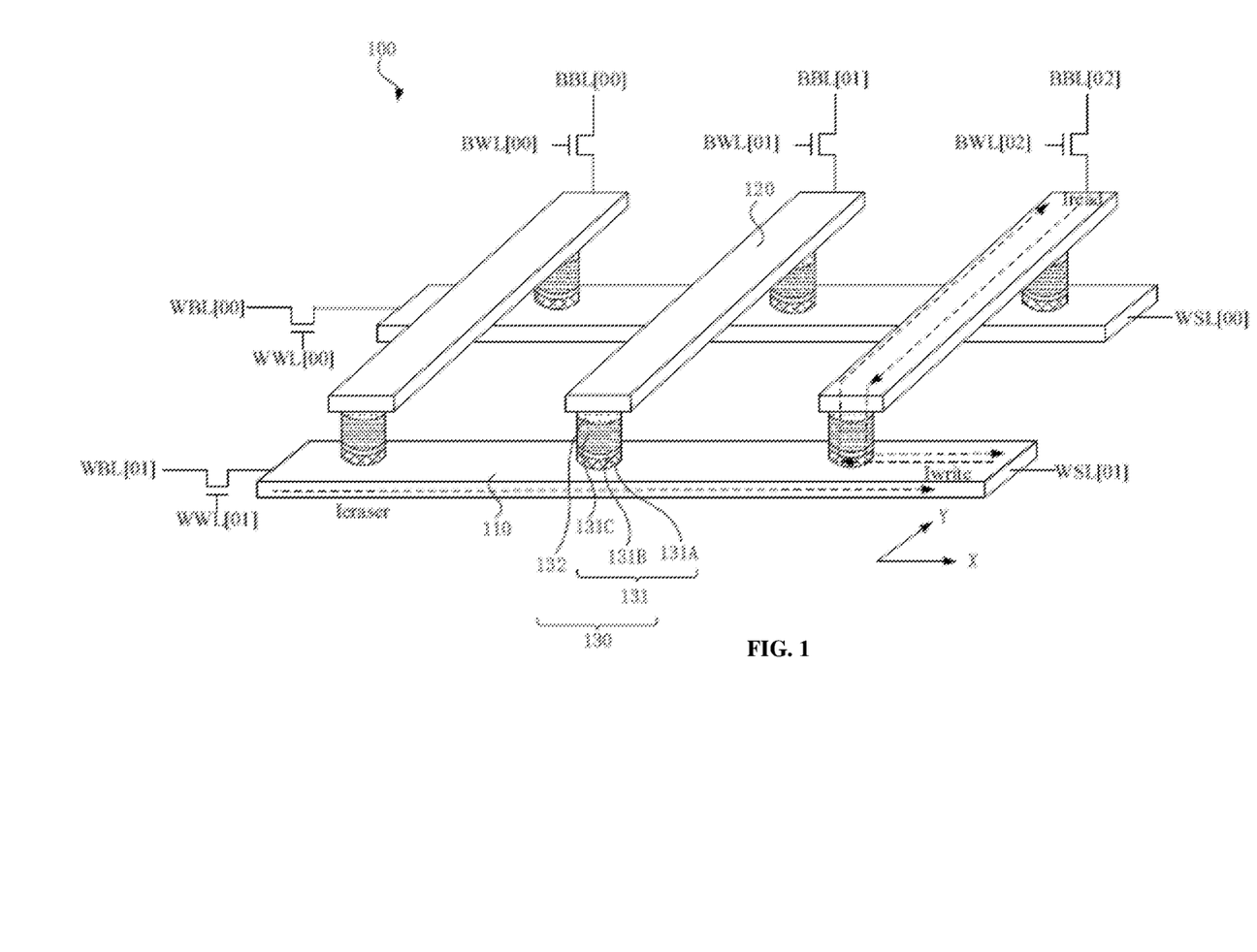
FIG. 1 is a schematic structural diagram of a magnetic memory according to a first embodiment of the present application.

FIG. 1 is a schematic structural diagram of a magnetic memory according to a first embodiment of the present application. Referring to FIG. 1, the magnetic memory according to the present application includes at least one cell layer 100. In this embodiment, the magnetic memory includes a cell layer 100.

The cell layer 100 includes a plurality of paralleled first conductors 110, a plurality of paralleled second conductors 120 and a plurality of memory elements 130. Numbers of the first conductor 110, the second conductor 120 and the memory element 130 may be set according to a storage requirement of the magnetic memory. Only two paralleled first conductors 110, three paralleled second conductors 120 and six memory elements 130 are schematically illustrated in FIG. 1, which does not constitute any limitation on the present application.

The first conductor 110 is located in a first plane (not illustrated in the drawing). In this embodiment, the first conductors 110 extend along an X direction and are arranged in parallel along a Y direction, and the first plane is an XY plane.

The second conductor 120 is located in a second plane (not illustrated in the drawing), and the first plane is parallel to the second plane. In this embodiment, the second conductors 120 extend along the Y direction and are arranged in parallel along the X direction, and the second plane is also an XY plane. The first plane is a plane parallel to the second plane.

A projection of the second conductor 120 on the first plane intersects with the first conductor 110; or a projection of the first conductor 110 on the second plane intersects with the second conductor 120. Specifically, in a direction perpendicular to the first plane, the projection of the second conductor 120 on the first plane intersects with the first conductor 110; or in a direction perpendicular to the second plane, the projection of the first conductor 110 on the second plane intersects with the second conductor 120. Since the first plane is parallel to the second plane, the first conductor 110 and the second conductor 120 do not intersect directly, but their projections intersect on a plane.

Further, in this embodiment, the projection of the second conductor 120 on the first plane intersects vertically with the first conductor 110. In other embodiments of the present application, the projection of the second conductor 120 on the first plane does not intersect vertically with the first conductor 110, but intersects with the first conductor at an acute or obtuse angle.

Further, in order to improve conductivity of the first conductor 110 and the second conductor 120, the first conductor 110 and the second conductor 120 may be made of following materials: heavy metal (e.g., Pt, Ta, etc.) or semimetal (e.g., $MoTe_2$) or chalcogenide (e.g., $Bi_xTe_{1-x}$).

The plurality of memory elements 130 are arranged between the first plane and the second plane. That is, the plurality of memory elements 130 are arranged in an interlayer formed by the first plane and the second plane. Each memory element 130 includes a magnetic tunnel junction 131 and a bidirectional gating device 132 arranged in series along a direction perpendicular to the first plane. In this embodiment, the memory element 130 is arranged at an intersection between the first conductor 110 and the second conductor 120, the magnetic tunnel junction 131 is connected to the first conductor 110, and the bidirectional gating device 132 is connected to the second conductor 120. In other embodiments of the present application, positions of the magnetic tunnel junction 131 and the bidirectional gating device 132 are also interchangeable; that is, the magnetic tunnel junction 131 is connected to the second conductor 120, and the bidirectional gating device 132 is connected to the first conductor 110.

The bidirectional gating device 132 is configured to be turned on when a threshold voltage and/or a threshold current are/is applied. The "turn on" means that the bidirectional gating device 132 changes from a high-resistance state to a low-resistance state. Specifically, when a voltage or current applied to the bidirectional gating device 132 is a first threshold voltage or current or exceeds the threshold voltage or current, the bidirectional gating device 132 changes from a high-resistance state to a low-resistance state, so that the magnetic tunnel junction 131 is electrically connected to the second conductor 120. The threshold voltage or current depends on material properties of the magnetic tunnel junction 131. For example, in this embodiment, the bidirectional gating device 132 is made of doped hafnium oxide, with an on threshold voltage of 0.25 V. When the voltage applied to the bidirectional gating device 132 is 0.25 V or exceeds 0.25 V, the bidirectional gating device 132 is turned on. When the voltage applied to the bidirectional gating device 132 is less than 0.25 V, the bidirectional gating device 132 is not turned on. The doped hafnium oxide has a high on/off ratio and low on resistance, so it is an ideal material for the bidirectional gating device. Certainly, the bidirectional gating device 132 may also be made of other materials that can implement a threshold turn-on function, and the present application is not limited thereto.

Since the bidirectional gating device 132 can be turned on when the threshold voltage and/or the threshold current are/is applied, different memory elements 130 may be separately controlled with the bidirectional gating device as a control switch. Specifically, if one or some memory elements 130 are required to be operated, the bidirectional gating devices 132 corresponding to the one or some memory elements 130 may be controlled to be turned on, while the bidirectional gating devices 132 corresponding to other non-selected memory elements 130 are not turned on, so as to realize a selective operation on the memory element 130.

Further, the magnetic tunnel junction 131 includes a free layer 131A connected to the first conductor 110, a non-magnetic insulating layer 131B arranged on an upper surface of the free layer 131A and a fixed layer 131C arranged on an upper surface of the non-magnetic insulating layer 131B. A magnetic moment direction of the free layer 131A is variable, and a magnetic moment direction of the fixed layer 131C is fixed. Due to a tunnel magnetoresistance effect, a resistance value between the fixed layer 131C and the free layer 131A changes with a switch in the magnetic moment direction of the free layer 131A, so as to realize a write to the magnetic memory.

The bidirectional gating device 132 has one terminal connected to the fixed layer 131C and the other terminal connected to the second conductor 120. A first terminal and a second terminal of the bidirectional gating device 132 are provided for ease of description only. For the bidirectional gating device 132, there is no difference between the first terminal and the second terminal; that is, any terminal of the bidirectional gating device 132 may be connected to the fixed layer 131C.

In the magnetic memory according to the present application, a conventional magnetic memory design is changed and memory density of the magnetic memory is greatly increased.

Further, the first conductor 110 includes a first terminal and a second terminal. The magnetic memory further includes a plurality of write bitlines WBL and a plurality of first selection transistors WWL. The first selection transistor WWL is configured to be electrically connected to the first terminal of the first conductor 110 and the write bitline WBL in response to a first control signal.

Specifically, only two write bitlines WBL and two first selection transistors WWL are schematically illustrated in FIG. 1, which are a write bitline WBL[00], a write bitline WBL[01], a first selection transistor WWL[00] and a first selection transistor WWL[01] respectively. Since the write bitline WBL is not an improvement to the present application, it is illustrated in the drawings only with a suspension line segment. The first selection transistor WWL[00] is configured to be electrically connected to the first terminal of the first conductor 110 and the write bitline WBL[00] in response to the first control signal. The first selection transistor WWL[01] is configured to be electrically connected to the first terminal of the first conductor 110 and the write bitline WBL[01] in response to the first control signal.

Further, the magnetic memory further includes a source line WSL. The source line WSL is electrically connected to the second terminal of the first conductor 110, for example, they are electrically connected through a transistor switch. Specifically, only two source lines WSL are schematically illustrated in FIG. 1, which are a source line WSL[00] and a source line WSL[01] respectively. The source line WSL[00] is electrically to the second terminal of the first conductor 110, and the source line WSL[01] is electrically to the second terminal of the other first conductor 110.

Further, the magnetic memory further includes a plurality of bitlines BBL and a plurality of second selection transistors BWL. The second selection transistor BWL is configured to be electrically connected to the second conductor 120 and the bitline BBL in response to a second control signal. Specifically, only three bitlines BBL and three second selection transistors BWL are schematically illustrated in FIG. 1, which are a bitline BBL[00], a bitline BBL[01], a bitline BBL[02], a second selection transistor BWL[00], a second selection transistor BWL[01] and a second selection transistor BWL[02] respectively. The second selection transistor BWL[00] is configured to be electrically connected to the second conductor 120 and the bitline BBL[00] in response to the second control signal, the second selection transistor BWL[01] is configured to be electrically connected to the second conductor 120 and the bitline BBL[01] in response to the second control signal, and the second selection transistor BWL[02] is configured to be electrically connected to the second conductor 120 and the bitline BBL[02] in response to the second control signal.

Figure 2:
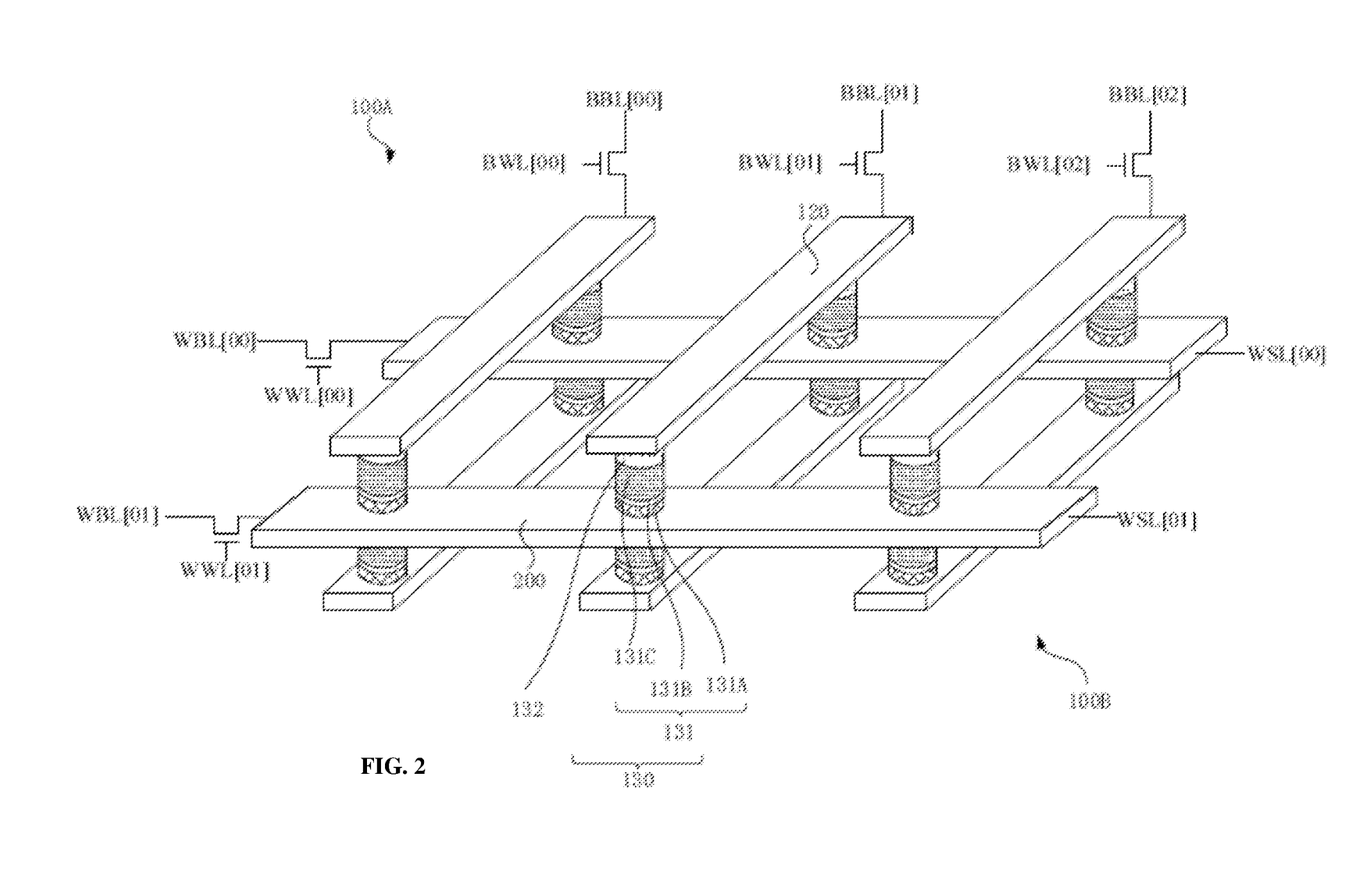
FIG. 2 is a schematic structural diagram of the magnetic memory according to a second embodiment of the present application.
Figure 3:
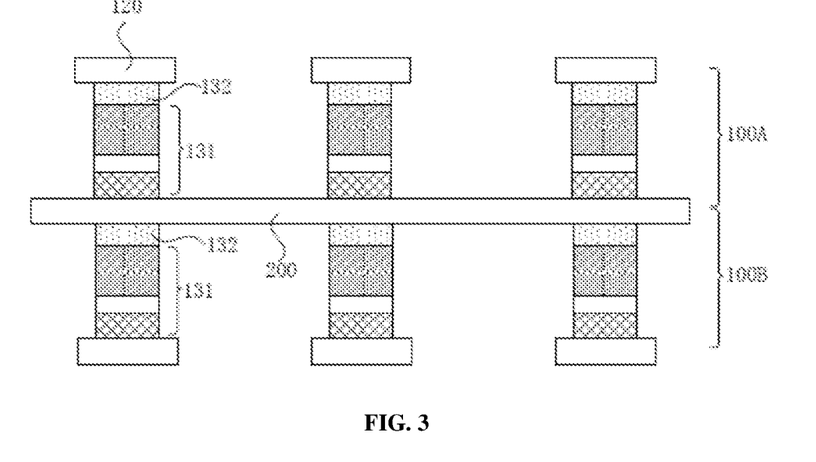
FIG. 3 is a front view of the structure shown in FIG. 2.

In order to further increase the memory density of the magnetic memory, the present application further provides a second embodiment. The second embodiment is different from the first embodiment in that the second embodiment includes a plurality of cell layers that are stacked. Specifically, referring to FIG. 2 and FIG. 3, FIG. 2 is a schematic structural diagram of the magnetic memory according to a second embodiment of the present application, and FIG. 3 is a front view of the structure shown in FIG. 2. In the second embodiment, the magnetic memory includes a plurality of cell layers that are sequentially arranged along a direction perpendicular to the first plane. In this embodiment, the magnetic memory includes two cell layers, which are an upper cell layer 100A and a lower cell layer 100B respectively. The upper cell layer 100A and the lower cell layer 100B are sequentially arranged along a direction perpendicular to the first plane.

Adjacent cell layers are connected to a same conductor. The conductor is used as the first conductor in the upper cell layer 100A and as a second conductor in the lower cell layer 100B. Specifically, in this embodiment, the upper cell layer 100A and the lower cell layer 100B are adjacent cell layers and share a conductor 200. In the upper cell layer 100A, the conductor 200 is connected to the magnetic tunnel junction 131 of the memory element 130, so the conductor 200 is used as the first conductor in the upper cell layer 100A. In the lower cell layer 100B, the conductor 200 is connected to the bidirectional gating device 132, so the conductor 200 is used as the second conductor in the lower cell layer 100B.

Figure 4:
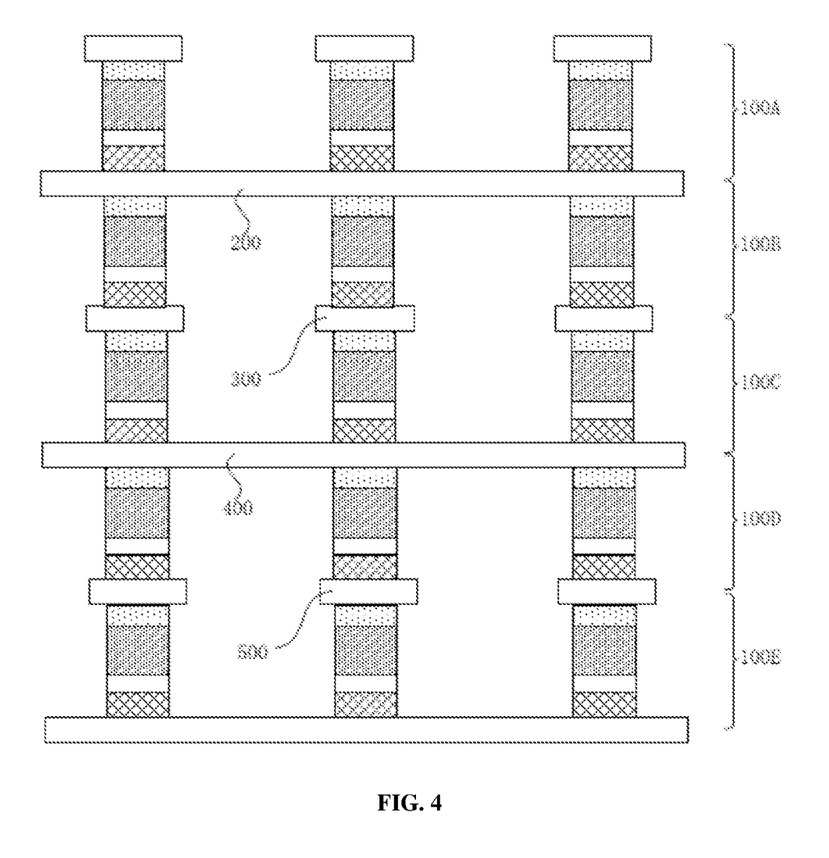
FIG. 4 is a front view of the magnetic memory according to a third embodiment of the present application.

In the second embodiment, the magnetic memory includes only two cell layers. In other embodiments of the present application, in order to further increase the memory density of the magnetic memory, the magnetic memory may include a plurality of cell layers that are sequentially arranged along a direction perpendicular to the first plane. Refer to FIG. 4, which is a front view of the magnetic memory according to a third embodiment of the present application. In the third embodiment, the magnetic memory may include a plurality of cell layers that are sequentially arranged along a direction perpendicular to the first plane. 5 cell layers are schematically illustrated in FIG. 4, which are cell layers 100A, 100B, 100C, 100D and 100E respectively. The five cell layers are sequentially arranged along a direction perpendicular to the first plane.

Adjacent cell layers are connected to a same conductor. The conductor is used as the first conductor in an upper cell layer and as a second conductor in a lower cell layer. For example, in the third embodiment, if the cell layer 100A and the cell layer 100B are adjacent to each other and are connected to a conductor 200, the conductor 200 is used as the first conductor in the cell layer 100A and the conductor 200 is used as the second conductor in the cell layer 100B; if the cell layer 100B and the cell layer 100C are adjacent to each other and are connected to a conductor 300, the conductor 300 is used as the first conductor in the cell layer 100B and the conductor 300 is used as the second conductor in the cell layer 100C; if the cell layer 100C and the cell layer 100D are adjacent to each other and are connected to a conductor 400, the conductor 400 is used as the first conductor in the cell layer 100C and the conductor 400 is used as the second conductor in the cell layer 100D; and if the cell layer 100D and the cell layer 100E are adjacent to each other and are connected to a conductor 500, the conductor 500 is used as the first conductor in the cell layer 100D and the conductor 500 is used as the second conductor in the cell layer 100E.

In the second embodiment and the third embodiment, bidirectional gating devices 132 of memory elements 130 of all the cell layers are located above the magnetic tunnel junction 131, so that the conductor connected to adjacent cell layers is used as the first conductor in the upper cell layer and as the second conductor in the lower cell layer. In other embodiments of the present application, the bidirectional gating device 132 of the memory element 130 may also be located below the magnetic tunnel junction 131. Its principle is the same as that in the second embodiment and the third embodiment and is not described in detail.

In the second embodiment or the third embodiment of the present application, the conductor connected to the adjacent cell layers are in different connection relationships with the memory element 130 in the two layers; that is, the conductor shared by the adjacent cell layers have different functions in the two layers. In the second embodiment or the third embodiment of the present application, the conductor connected to the adjacent cell layers are in different connection relationships with the memory element 130 in the two layers; that is, the conductor shared by the adjacent cell layers have a same function in the two layers. That is, the conductor shared by the adjacent cell layers is used as the first conductor in the upper cell layer and the second conductor in the lower cell layer.

Figure 5:
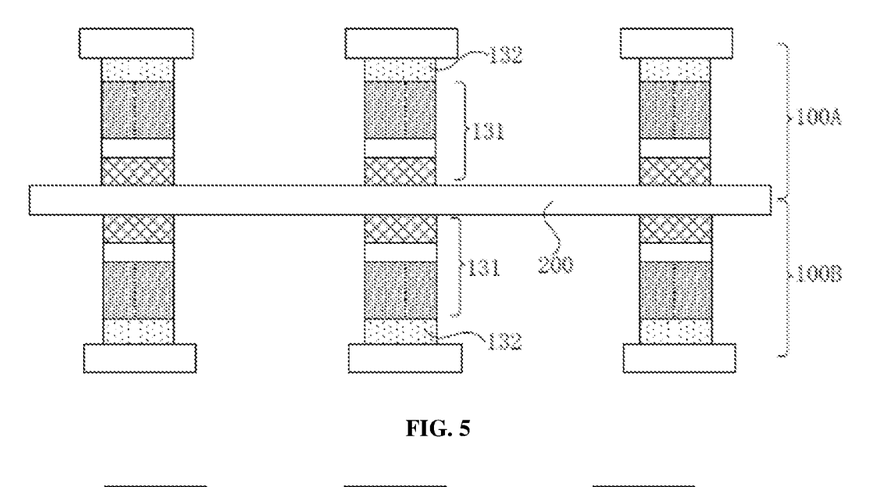
FIG. 5 is a front view of the magnetic memory according to a fourth embodiment of the present application.

Specifically, refer to FIG. 5, which is a front view of the magnetic memory according to a fourth embodiment of the present application. In the fourth embodiment, the magnetic memory includes two cell layers, which are an upper cell layer 100A and a lower cell layer 100B respectively. The upper cell layer 100A and the lower cell layer 100B are sequentially arranged along a direction perpendicular to the first plane.

The upper cell layer 100A and the lower cell layer 100B are connected to a same conductor. The conductor is used as the first conductor in the upper cell layer 100A and the second conductor in the lower cell layer 100B. Specifically, in this embodiment, the conductor shared by the upper cell layer 100A and the lower cell layer 100B is a conductor 200. In the upper cell layer 100A, the conductor 200 is connected to the magnetic tunnel junction 131 of the memory element 130, so the conductor 200 is used as the first conductor in the upper cell layer 100A. In the lower cell layer 100B, the conductor 200 is connected to the magnetic tunnel junction 131 of the memory element 130, so the conductor 200 is also used as the first conductor in the lower cell layer 100B. In other embodiments of the present application, the memory element of each layer may also be turned so that the conductor 200 is connected to the magnetic tunnel junctions 131 of the memory elements 130 of the upper cell layer 100A and the lower cell layer 100B, and the conductor 200 is used as the second conductor.

Figure 6:
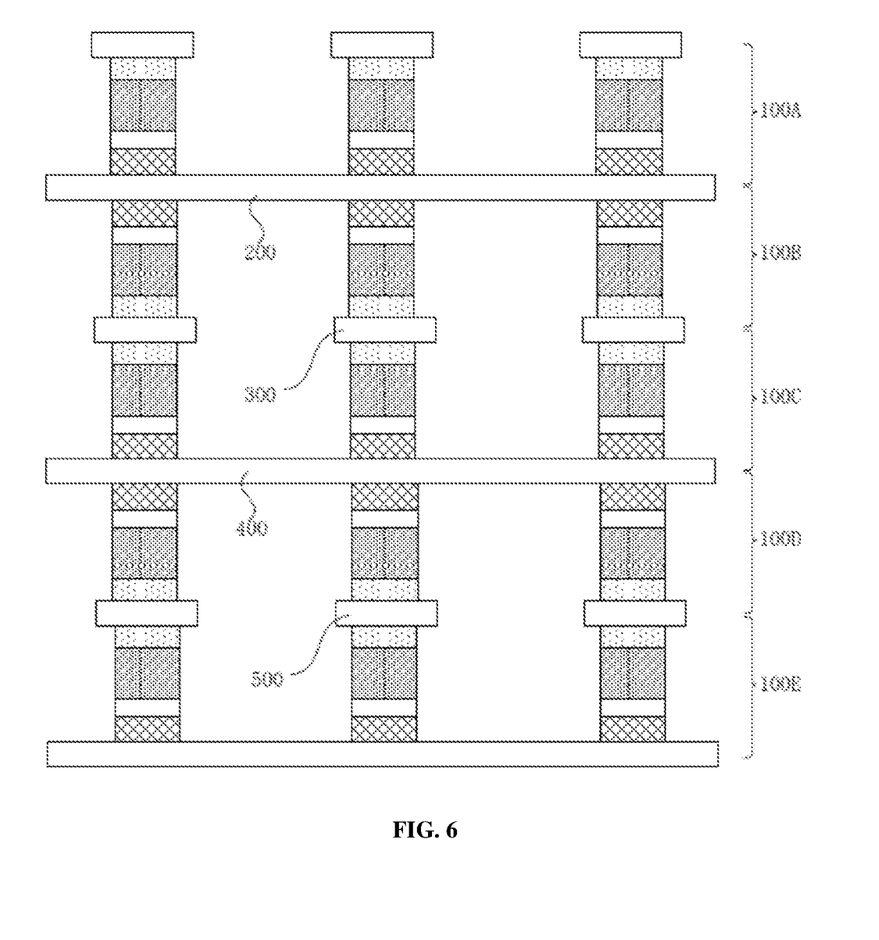
FIG. 6 is a front view of the magnetic memory according to a fifth embodiment of the present application.

In the fourth embodiment, the magnetic memory includes only two cell layers. In other embodiments of the present application, in order to further increase the memory density of the magnetic memory, the magnetic memory may include a plurality of cell layers that are sequentially arranged along a direction perpendicular to the first plane. Refer to FIG. 6, which is a front view of the magnetic memory according to a fifth embodiment of the present application. In the fifth embodiment, the magnetic memory may include a plurality of cell layers that are sequentially arranged along a direction perpendicular to the first plane. 5 cell layers are schematically illustrated in FIG. 6, which are cell layers 100A, 100B, 100C, 100D and 100E respectively. The five cell layers are sequentially arranged along a direction perpendicular to the first plane.

Adjacent cell layers are connected to a same conductor. The conductor is used as the first conductor in an upper cell layer and the second conductor in a lower cell layer. For example, in the fifth embodiment, if the cell layer 100A and the cell layer 100B are adjacent to each other and are connected to a conductor 200, the conductor 200 is used as the first conductor in the cell layer 100A and the conductor 200 is also used as the first conductor in the cell layer 100B; if the cell layer 100B and the cell layer 100C are adjacent to each other and are connected to a conductor 300, the conductor 300 is used as the second conductor in the cell layer 100B and the conductor 300 is also used as the second conductor in the cell layer 100C; if the cell layer 100C and the cell layer 100D are adjacent to each other and are connected to a conductor 400, the conductor 400 is used as the first conductor in the cell layer 100C and the conductor 400 is also used as the first conductor in the cell layer 100D; and if the cell layer 100D and the cell layer 100E are adjacent to each other and are connected to a conductor 500, the conductor 500 is used as the second conductor in the cell layer 100D and the conductor 500 is also used as the second conductor in the cell layer 100E.

It may be understood that in other embodiments of the present application, a direction of the memory element 130 in each layer may also be turned to change a connection relationship among the magnetic tunnel junction, the bidirectional gating device and the shared conductor. Its connection principle is the same as that in the fifth embodiment and is not described in detail Further, only position relationships among the first conductor, the memory element and the second conductor are schematically illustrated in the drawings of the present application. In a practical semiconductor process, a space outside the first conductor, the memory element and the second conductor may be filled with an insulating material or other structural materials, which is not described in detail herein.

Figure 7:
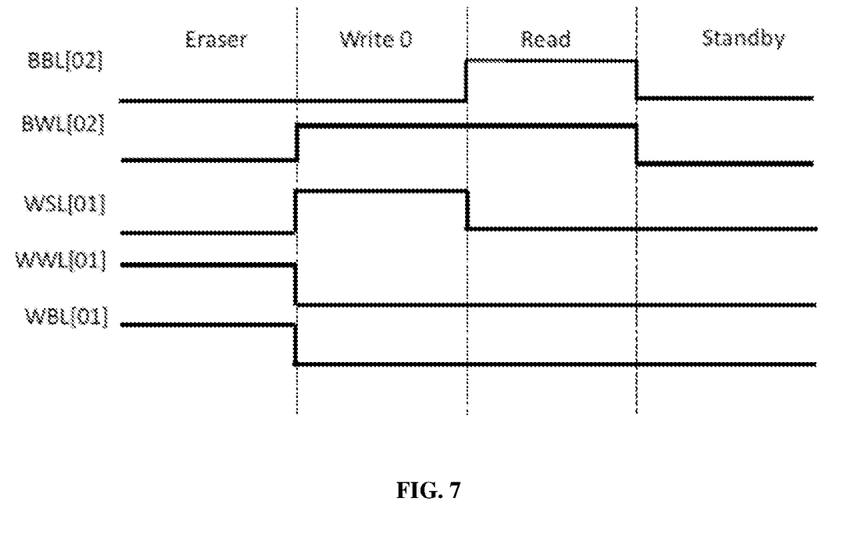
FIG. 7 is a timing diagram of a reading/writing method of a magnetic memory according to a sixth embodiment of the present application.

The present application further provides a reading/writing method of the magnetic memory as described above. Referring to FIG. 1 and FIG. 7, FIG. 7 is a timing diagram of a reading/writing method of a magnetic memory according to a sixth embodiment of the present application.

The reading/writing method according to the present application includes following operations.

Eraser: a first current Ieraser is provided to the magnetic memory, and the first current Ieraser flows through the first conductor 110 without flowing through the memory element 130, so that the memory element 130 is in a first memory state.

The first current Ieraser flows only through the first conductor 110. The first current Ieraser acts on the magnetic tunnel junction 131 through the first conductor 110, so that the magnetic moment direction of the free layer 131A of the magnetic tunnel junction 131 changes to a same direction, for example, the same as or opposite to the magnetic moment direction of the fixed layer 131C. After the first current Ieraser is applied to the first current Ieraser, all memory elements connected to the first conductor 110 are in a same memory state, that is, a first memory state. The first memory state may be memory "0" or memory "1". For example, in this embodiment, under the action of the first current Ieraser, the magnetic moment direction of the free layer 131A is opposite to that of the fixed layer 131C. That is, the first memory state is memory "1", so that only memory "1" is modified to memory "0" during a write, which greatly reduces a loss of the magnetic tunnel junction. It should be noted that the memory state "1" may also be indicated as that the magnetic moment direction of the free layer 131A is the same as that of the fixed layer 131C, which can be designed by those skilled in the art according to a requirement.

In this embodiment, the first selection transistor WWL is controlled through the first control signal to enable the first selection transistor WWL to be electrically connected to the first terminal of the first conductor 110 and the write bitline WBL in response to the first control signal. The write bitline WBL is at a high level, the source line WSL is at a low level, and the first current Ieraser flows from the write bitline WBL to the source line WSL through the first conductor 110. Alternatively, in another embodiment of the present application, the write bitline WBL is at a low level, the source line WSL is at a high level, and the first current Ieraser flows from the source line WSL to the write bitline WBL through the first conductor 110.

Write: a second current Iwrite is provided to the magnetic memory, and the second current Iwrite flows through a selected memory element, so that the selected memory element changes from the first memory state to a second memory state.

Different memory elements are controlled separately with the bidirectional gating device 132 as a control switch. In the write step, the selected memory element is configured as the memory element when the threshold voltage and/or the threshold current are/is applied to the bidirectional gating device 132. That is, in the step, if one memory element 130 is required to be operated, the bidirectional gating device 132 thereof is switched to an on state, so as to realize an electrical connection among the memory element 130, the first conductor 110 and the second conductor 120.

In the write step, the second current Iwrite flows through the memory element 130, and then the second current Iwrite may change the magnetic moment direction of the free layer 131A, so that the magnetic moment direction of the free layer 131A is the same as or opposite to that of the fixed layer 131C.

Further, the first current Ieraser and the second current Iwrite reverse a variation trend of the magnetic moment direction of the free layer.

For example, in this embodiment, in the eraser, the first current Ieraser enables the magnetic moment direction of the free layer 131A to change in a direction opposite to that of the fixed layer 131C, and the second current Iwrite enables the magnetic moment direction of the free layer 131A to change in a direction the same as that of the fixed layer 131C; that is, the first memory state is memory "1" and the second memory state is memory "0".

In another example, in other embodiments, in the eraser, the first current Ieraser enables the magnetic moment direction of the free layer 131A to change in a direction the same as that of the fixed layer 131C, and the second current Iwrite enables the magnetic moment direction of the free layer 131A to change in a direction opposite to that of the fixed layer 131C; that is, the first memory state is memory "0" and the second memory state is memory "1".

It should be noted that memory "0" may also be indicated as that the magnetic moment direction of the free layer 131A is opposite to that of the fixed layer 131C, and the same is true for memory "1". Those skilled in the art should understand that this is only a difference in definitions, and can be defined as needed.

In this embodiment, the second selection transistor BWL is controlled through the second control signal to enable the second selection transistor BWL to be electrically connected to the second conductor 120 and the bitline BBL in response to the second control signal and enable the second current Iwrite to flow through a selected memory element 130, so as to achieve a purpose of changing the memory state of the memory element 130 from the first memory state to the second memory state.

For example, the second selection transistor BWL is controlled to be turned on through the second control signal, the bitline BBL is at a low level, the source line WSL is at a high level, and from the source line SWL, the second current Iwrite flows from the first conductor 110 to the bitline BBL through the memory element 130 and the second conductor 120. Alternatively, the bitline BBL is at a high level, the source line WSL is at a low level, and from the bitline BBL, the second current Iwrite flows from the second conductor 120 to the source line WSL through the memory element 130 and the first conductor 110.

Further, the present application further provides a read operation of the magnetic memory.

Read: a third current is provided to the magnetic memory, and the third current Iread flows from the second conductor 120 to the first conductor 110 through the memory element 130.

Different memory elements are controlled separately with the bidirectional gating device 132 as a control switch, which is the same as the write step. In the read step, if one memory element 130 is required to be operated, the bidirectional gating device 132 thereof is switched to an on state, and the bidirectional gating devices 132 of other memory elements 130 are switched to an off state, so as to operate the memory element 130 separately, thereby avoiding the influence of other memory elements 130 on the read.

During execution of the read, the third current Iread flows from the memory element 130, and a potential difference may be generated between two terminals of the memory element 130. Resistance of the memory element 130 may be determined according to the magnitude of the potential difference, so that an orientation relation of the magnetic moment directions of the free layer 131A and the fixed layer 131C of the magnetic tunnel junction can be obtained, and the memory state of the memory element 130 can be read. Alternatively, the memory state of the memory element 130 may also be determined according to the magnitude of the third current Iread, which may be designed by those skilled in the art according to a requirement.

In this embodiment, the second selection transistor BWL is controlled through the third control signal to enable the second selection transistor BWL to be electrically connected to the second conductor 120 and the bitline BBL in response to the third control signal and enable the third current Iread to flow through a selected memory element 130, so as to obtain the memory state of the memory element 130.

The above describes the reading/writing method of only one cell layer, and a reading/writing method of a magnetic memory with a plurality of cell layers is the same as that of the single layer and is not described in detail.

The above descriptions are only preferred implementations of the present application. It should be pointed out that, those of ordinary skill in the art may further make several improvements and modifications without departing from the principle of the present application. Such improvements and modifications should also fall within the protection scope of the present application.

What is claimed is:

1. A magnetic memory, comprising at least one cell layer, each of the at least one cell layer comprising:
    a plurality of paralleled first conductors located in a first plane, each of the plurality of paralleled first conductors comprises a first terminal and a second terminal;
    a plurality of paralleled second conductors located in a second plane, the first plane being parallel to the second plane, and a projection of one of the plurality of paralleled second conductors on the first plane intersecting with one of the plurality of paralleled first conductors;
    a plurality of memory elements arranged between the first plane and the second plane, each of the plurality of memory elements comprising a magnetic tunnel junction and a bidirectional gating device arranged in series along a direction perpendicular to the first plane, the magnetic tunnel junction being connected to a corresponding one of the plurality of paralleled first conductors, the bidirectional gating device being connected to a corresponding one of the plurality of paralleled second conductors, and the bidirectional gating device being configured to be turned on when at least one of a threshold voltage or a threshold current is applied; and
    a source line, the source line being electrically connected to the second terminal of the corresponding one of the plurality of paralleled first conductors.

2. The magnetic memory according to claim 1, wherein the magnetic tunnel junction comprises:

a free layer connected to the corresponding one of the plurality of paralleled first conductors;

a non-magnetic insulating layer arranged on an upper surface of the free layer; and a fixed layer arranged on an upper surface of the non-magnetic insulating layer, a magnetic moment direction of the free layer being variable, and a magnetic moment direction of the fixed layer being fixed, wherein the bidirectional gating device has one terminal connected to the fixed layer and a second terminal connected to the corresponding one of the plurality of paralleled second conductors.

3. The magnetic memory according to claim 1, wherein the magnetic memory further comprises a plurality of write bitlines and a plurality of first selection transistors, each of the plurality of first selection transistors being configured to be electrically connected to the first terminal of the corresponding one of the plurality of paralleled first conductors and a corresponding one of the plurality of write bitlines in response to a first control signal.

4. The magnetic memory according to claim 1, wherein the magnetic memory further comprises a plurality of bitlines and a plurality of second selection transistors, each of the plurality of second selection transistors being configured to be electrically connected to a corresponding one of the plurality of paralleled second conductors and a corresponding one of the plurality of bitlines in response to a second control signal.

5. The magnetic memory according to claim 1, wherein the projection of the one of the plurality of paralleled second conductors on the first plane intersects vertically with the one of the plurality of paralleled first conductors.

6. The magnetic memory according to claim 1, wherein the at least one cell layer is a plurality of cell layers, the plurality of cell layers being sequentially arranged along the direction perpendicular to the first plane, and adjacent cell layers of the plurality of cell layers being connected to a same conductor, wherein the conductor is used as the corresponding one of the plurality of paralleled first conductors in an upper cell layer and as the corresponding one of the plurality of paralleled second conductors in a lower cell layer.

7. The magnetic memory according to claim 1, wherein different memory elements are controlled separately with the bidirectional gating device as a control switch.

8. The magnetic memory according to claim 1, wherein the bidirectional gating device is made of doped hafnium oxide.

9. A reading/writing method of a magnetic memory, the magnetic memory comprising at least one cell layer, each of the at least one cell layer comprising:

a plurality of paralleled first conductors located in a first plane, each of the plurality of paralleled first conductors comprises a first terminal and a second terminal;

a plurality of paralleled second conductors located in a second plane, the first plane being parallel to the second plane, and a projection of one of the plurality of paralleled second conductors on the first plane intersecting with one of the plurality of paralleled first conductors;

a plurality of memory elements arranged between the first plane and the second plane, each of the plurality of memory elements comprising a magnetic tunnel junction and a bidirectional gating device arranged in series along a direction perpendicular to the first plane, the magnetic tunnel junction being connected to a corresponding one of the plurality of paralleled first conductors, the bidirectional gating device being connected to a corresponding one of the plurality of paralleled second conductors, and the bidirectional gating device being configured to be turned on when at least one of a threshold voltage or a threshold current is applied; and a source line, the source line being electrically connected to the second terminal of the corresponding one of the plurality of paralleled first conductors;

the reading/writing method comprising:

providing a first current to the magnetic memory, the first current flowing through the corresponding one of the plurality of paralleled first conductors without flowing through a corresponding one of the plurality of memory elements, so that the corresponding one of the plurality of memory elements is in a first memory state; and providing a second current to the magnetic memory, the second current flowing through a selected memory element, so that the selected memory element changes from the first memory state to a second memory state.

10. The reading/writing method according to claim 9, wherein the magnetic tunnel junction comprises:

a free layer connected to the corresponding one of the plurality of paralleled first conductors;

a non-magnetic insulating layer arranged on an upper surface of the free layer; and a fixed layer arranged on an upper surface of the non-magnetic insulating layer, a magnetic moment direction of the free layer being variable, and a magnetic moment direction of the fixed layer being fixed, wherein the bidirectional gating device has one terminal connected to the fixed layer and a second terminal connected to the corresponding one of the plurality of paralleled second conductor; and the reading/writing method comprises:

reversing, by the first current and the second current, a variation trend of the magnetic moment direction of the free layer.

11. The reading/writing method according to claim 10, wherein the first current enables the magnetic moment direction of the free layer to change in a direction opposite to that of the fixed layer, and the second current enables the magnetic moment direction of the free layer to change in a direction the same as that of the fixed layer.

12. The reading/writing method according to claim 10, wherein the first current enables the magnetic moment direction of the free layer to change in a direction the same as that of the fixed layer, and the second current enables the magnetic moment direction of the free layer to change in a direction opposite to that of the fixed layer.

13. The reading/writing method according to claim 9, wherein the magnetic memory further comprises a plurality of write bitlines and a plurality of first selection transistors, each of the plurality of first selection transistors being configured to be electrically connected to the first terminal of the corresponding one of the plurality of paralleled first conductors and a corresponding one of the plurality of write bitlines in response to a first control signal; and the reading/writing method comprises:

controlling a corresponding one of the plurality of first selection transistors through the first control signal to enable the corresponding one of the plurality of first selection transistors to be electrically connected to the first terminal of the corresponding one of the plurality of paralleled first conductors and the corresponding one of the plurality of write bitlines in response to the first control signal, so that the first current flows through the corresponding one of the plurality of paralleled first conductors.

14. The reading/writing method according to claim 13, the reading/writing method comprises: the first current flowing from the corresponding one of the plurality of write bitlines to the source line through the corresponding one of the plurality of paralleled first conductors, or the first current flowing from the source line to the corresponding one of the plurality of write bitlines through the corresponding one of the plurality of paralleled first conductors.

15. The reading/writing method according to claim 9, wherein the magnetic memory further comprises a plurality of bitlines and a plurality of second selection transistors, each of the plurality of second selection transistors being configured to be electrically connected to a corresponding one of the plurality of paralleled second conductors and a corresponding one of the plurality of bitlines in response to a second control signal; and the reading/writing method comprises:

controlling a corresponding one of the plurality of second selection transistors through the second control signal to enable the corresponding one of the plurality of second selection transistors to be electrically connected to the corresponding one of the plurality of paralleled second conductors and the corresponding one of the plurality of bitlines in response to the second control signal, so that the second current flows through the selected memory element.

16. The reading/writing method according to claim 9, wherein the reading/writing method further comprises: providing a third current to the magnetic memory during a read operation, the third current flowing from the corresponding one of the plurality of paralleled second conductors to the corresponding one of the plurality of paralleled first conductors through the corresponding one of the plurality of memory elements.

17. The reading/writing method according to claim 9, wherein different memory elements of the plurality of memory elements are controlled separately with the bidirectional gating device as a control switch; and in the step of providing a second current to the magnetic memory, the selected memory element is configured as the memory element when the at least one of the threshold voltage or the threshold current is applied to the bidirectional gating device.

* * * * *